United States Patent [19]

Greaves et al.

[11] Patent Number: 4,686,486

[45] Date of Patent: Aug. 11, 1987

[54] ACTIVE FILTER HAVING SERIES RESONANT ACTIVE FILTER TERMINATED BY PARALLEL RESONANT ACTIVE FILTER

[75] Inventors: Alan J. Greaves, Needham Market; Phillip J. Hunter, Kirton, both of England

[73] Assignee: British Telecommunications public limited company, England

[21] Appl. No.: 751,853

[22] Filed: Jul. 5, 1985

[30] Foreign Application Priority Data

Jul. 5, 1984 [GB] United Kingdom ................. 8417159

[51] Int. Cl.$^4$ ............................................. H03F 3/181
[52] U.S. Cl. .................................... 330/107; 330/303; 333/213; 333/217
[58] Field of Search ............... 330/107, 109, 302, 303, 330/304, 305, 306; 333/213, 216, 217

[56] References Cited

U.S. PATENT DOCUMENTS

| | | | |
|---|---|---|---|
| 3,886,469 | 5/1975 | Rollett et al. ....................... | 330/107 |
| 3,895,309 | 7/1975 | Rollett et al. ....................... | 330/107 |
| 4,147,997 | 4/1979 | Greaves .......................... | 333/216 X |
| 4,185,250 | 1/1980 | Regan .............................. | 333/213 X |
| 4,315,229 | 2/1982 | Greaves et al. ...................... | 333/216 |

FOREIGN PATENT DOCUMENTS 0015719 2/1980 European Pat. Off. .
3200615 7/1983 Fed. Rep. of Germany .

OTHER PUBLICATIONS

Girling, F. F. J., and Good, E. F., "Active Filters 13, Applications of the Active Ladder Synthesis", *Wireless World*, Sep. 1970, pp. 445–450.

1979 International Symposium on Circuits and Systems Proceedings, Jul. 17–19, 1979, Tokyo, JP, IEEE, pp. 26–29, New York, US; M. Hasler: "RC-Active Filters Using FDNR-Elements and Generalized Terminations".

Electronics Letters, vol. 14, No. 7, Mar. 30, 1978, pp. 225–226, London, GB; R. E. Massara: "Design Considerations for Lowpass and Highpass All-Pole F.D.N.R. Networks".

*Primary Examiner*—Eugene R. Laroche
*Assistant Examiner*—Steven J. Mottola
*Attorney, Agent, or Firm*—Nixon & Vanderhye

[57] ABSTRACT

A fourth (or higher) order filter has a series resonant section terminated by a parallel resonant section, both based on frequency dependent negative resistance (FDNR). The FDNR, resistance and capacitance (representing damping) of the series section are provided by a capacitive potential divider (C41,C42) connected between low impedance input (A) to the filter and an intermediate terminal forming the input of a unity-gain amplifier (A4) whose output is connected via a resistance (R4O) to the tapping point of the divider; the intermediate terminal is connected via a second resistance (R1) to the parallel section.

10 Claims, 12 Drawing Figures

ACTIVE FILTER HAVING SERIES RESONANT ACTIVE FILTER TERMINATED BY PARALLEL RESONANT ACTIVE FILTER

The present invention relates to fourth or higher order active filters.

Commonly these are realised using cascaded second order filters (ie the filter sections are isolated from one another). However the present invention proposes to simulate a fourth (or higher) order filter directly.

In one aspect, therefore, the invention provides a filter comprising a series resonant active filter section terminated by a parallel resonant active filter section, the series resonant section having an impedance equivalent to the series combination of capacitance, resistance and frequency dependent negative resistance and the parallel resonant section having an impedance equivalent to the parallel connection of at least resistance and frequency dependent negative resistance, in which the frequency dependent negative resistance, capacitance and resistance of the series resonant section are provided by an arrangement of components comprising a capacitive potential divider connected between a low impedance input to the filter and an intermediate connection point, and a unity gain amplifier having its input connected to the intermediate connection point and its output connected via a first resistance to the tapping point of the divider, the intermediate connection point being connected via a second resistance to the parallel filter section.

It may particularly be noted that the series filter section is used in a configuration in which the potential divider is not grounded, but forms an input: viz the section is configured as a three-terminal network rather than a two-terminal network. The input must however be fed from a low impedance source.

The frequency dependent negative resistance (FDNR) of the parallel resonant circuit may be provided by a loaded two-port containing a pair of amplifiers interconnected by impedances (sometimes referred to as a generalised immittance converter, or positive impedance converter) or by an arrangement in which an input terminal is connected via capacitances to the input and output of a high gain inverting amplifier, with a resistive element or network connected between the amplifier input and output.

It is noted that, by the use of frequency-dependent negative resistance (FDNR); circuits can readily be realised having capacitive elements which are all of the same value.

Another aspect of the invention concerns a particularly preferred form of damped series resonant element comprising a potential divider consisting of a pair of capacitances connected between the input of a unity gain amplifier and a first terminal, a resistance connected between the amplifier output and the tapping point of the divider and a pair of resistances connected from a second terminal to respectively the input and output of the amplifier.

For a two-terminal network, the first terminal is connected to ground; alternatively, as discussed above, the first terminal may be connected to a low-impedance input, the second terminal forming the output.

Some embodiments of the invention will now be described, by way of example, with reference to the accompanying drawings, in which.

Figure 1:
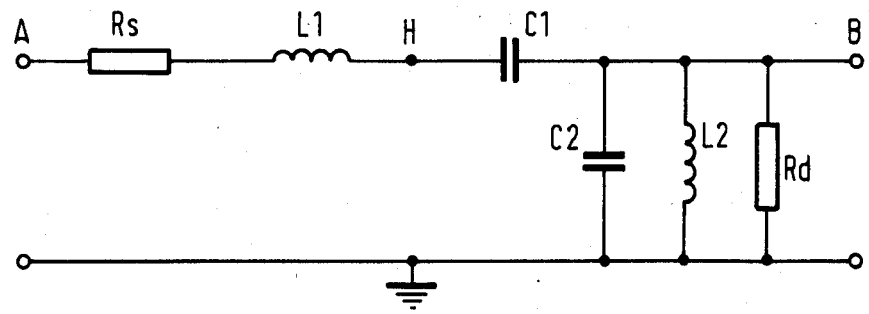
FIG. 1 is an equivalent circuit of a known fourth order filter based on inductance.

A fourth order all pole RC-active filter can be realised using cascaded second order sections of many types. For narrow bandpass responses the cascade approach suffers in that the response is sensitive to variations in component values. The present invention therefore proposes the use of a network in which a series resonant section is terminated by (as opposed to being isolated from) the parallel section. A passive LC ladder of this form is shown in FIG. 1. The source and load impedances Rs and Rd are shown as part of the filter since the filter must be correctly terminated in order to give the required response. A common way to provide the correct termination impedances is to include them in the filter and to isolate the true source and load by buffer amplifiers. However if the true source and load are suitable a passive match is possible.

Figure 2:
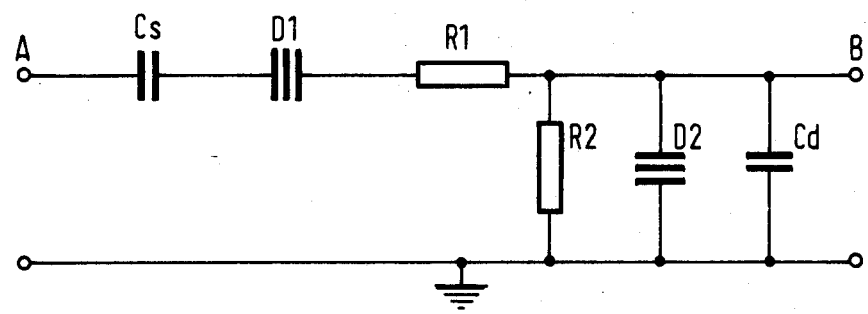
FIG. 2 is the dual of FIG. 1, using frequency dependent negative resistance (FDNR)

More particularly, it is proposed to simulate the arrangement of FIG. 2 which is a dual of the circuit of FIG. 1. The generic structure shown in FIG. 2 is not new, indeed it is obtained from a standard fourth order doubly terminated LC ladder by application of the Bruton transformation. Components D1 and D2 are frequency dependent negative resistances (FDNR). The termination components arising from this transformation are capacitances Cs and Cd. Two singly terminated varieties are immediately apparent, the first where Cs is replaced by a short circuit and the second where Cd is absent. There is not obvious practical advantage and some disadvantages in using the short circuit terminated variant but the case where Cd is absent has some merit, as will be discussed later.

First, certain subcircuits to be used in embodiments of the present invention will be described.

Figure 3:
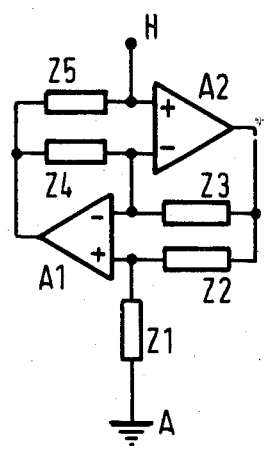
FIG. 3 is a circuit diagram of a loaded positive impedance converter.

A circuit diagram of a loaded positive impedance converter is shown in FIG. 3 in a generalised form. (See also Bruton, L T: 'Frequency selectivity using positive impedance converter-type networks,' Proc IEEE, Vol 56, pp. 1378–1379 (August 1968)). Two high gain differential amplifiers A1, A2 each have their outputs connected via impedances Z2,Z3,Z4,Z5 to the two inputs of the other amplifier. The inverting inputs of the amplifiers are connected together whilst the non-inverting input of amplifier A1 is connected via impedance Z1 to an "earth" terminal A and that of amplifier A2 is connected to point H. The equivalent circuit of the converter is an impedance Z given by $$Z = Z_1 Z_3 Z_5 / Z_2 Z_4$$

Where Z4 is a capacitor C14 (i.e. $Z_4 = 1/jwC$) and the remaining impedances are resistors, the circuit is a capacitively loaded gyrator, whose equivalent circuit is a pure inductor of inductance (for all resistors equal to R) $CR^2$. However, of interest for present purposes is the frequency dependent negative resistance (FDNR) in which any two of $Z_1$, $Z_3$, and $Z_5$ are capacitors, and the remainder resistors (see also the Bruton reference referred to above) when the impedance Z is real, negative and inversely proportional to the square of the frequency. It is convenient to select $Z_3$ and $Z_5$ (as shown in FIG. 4, which also illustrates the equivalent circuit) since then the amplifier A2 provides at its output a low-impedance output voltage which is directly proportional to that at H.

Figure 5:
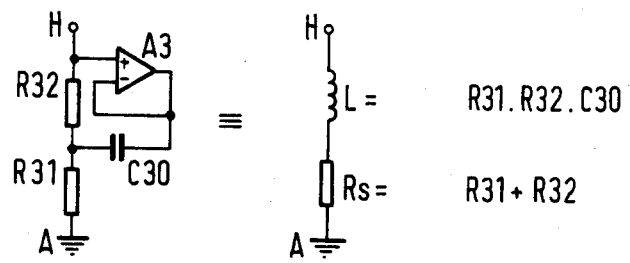
FIG. 5 is a circuit diagram and equivalent circuit of a lossy inductance arrangement.

FIG. 5 shows a lossy series inductance circuit due to Prescott, and its equivalent circuit in which the centre of a potential divider R31, R32 between points H and A is connected via a capacitor C30 to the output of a unity-gain amplifier A3 whose input is connected to H.

Figure 6:
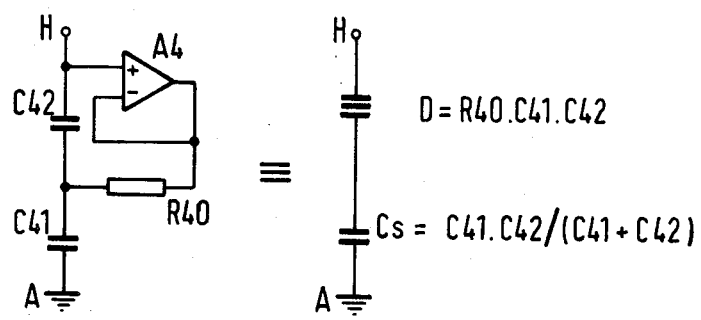
FIG. 6 is a lossy FDNR circuit, the dual FIG. 5.

FIG. 6 shows a dual of the Prescott circuit (a "lossy FDNR", which is the subject of our UK Pat. No. 1,413,721), where resistors R31, R32 become capacitors C41, C42, and capacitor C30, resistor R40, in an analogous arrangement with an amplifier A4. The equivalent circuit is that of an FDNR and capacitor in series. The aforementioned UK patent also describes and claims a parallel 'lossy' FDNR circuit, in which (FIG. 7) terminal B is connected by capacitances C61, C62 to the input and output of a high gain inverting amplifier A6, with a resistor R63 connected between the amplifier input and output.

Figure 4:
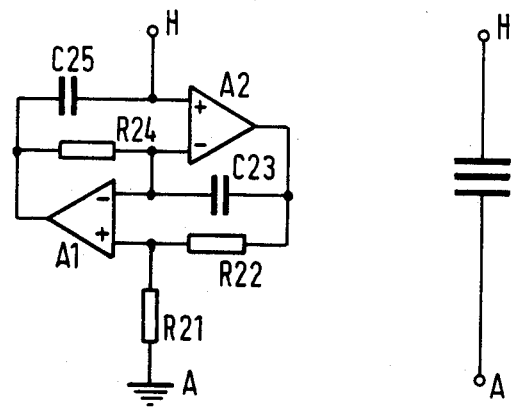
FIG. 4 is a circuit diagram of an FDNR version of FIG. 3.
Figure 8:
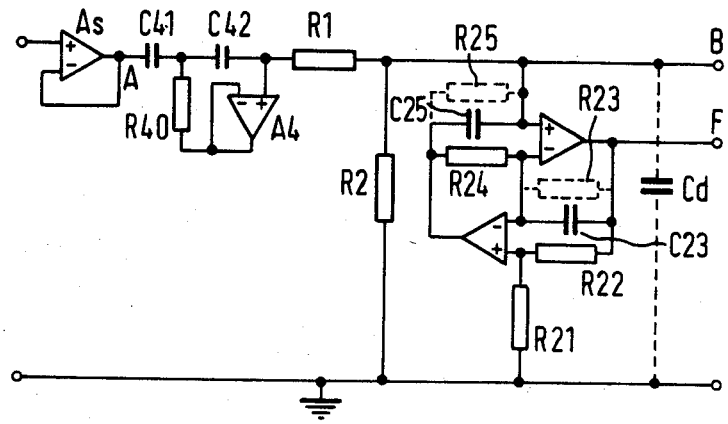
FIG. 8 is one example of a filter according to the invention, incorporating the filter elements of FIGS. 4 and 6.

The lossy FDNR circuit of FIG. 6 may replace Cs and D1 of FIG. 2, as illustrated in FIG. 8, whilst D2 is replaced by the circuit of FIG. 4. This FDNR circuit has the option of a low impedance output at F where the signal level is numerically related to that at B.

Once again there are several FDNR circuits which could be used and the capacitor Cd could be made redundant by inserting a resistor (R23, R25) in parallel with one or both of the capacitors C23 C25 of the output FDNR as illustrated in dotted lines. In all these variations the capacitors could be equal valued but only four amplifiers are still required.

It will be observed that unlike the situation shown in FIG. 6, the point A is no longer connected to earth. Although the equivalent circuit shown in FIG. 6 is in all other respects a completely accurate representation of the arrangement shown in that figure, the currents at A do not correspond. The inventor has recognised, however, that this is of no significance provided that point A is connected to a zero impedance point, not necessarily earth. In FIG. 8, a low impedance drive is provided by an amplifier As.

Figure 9:
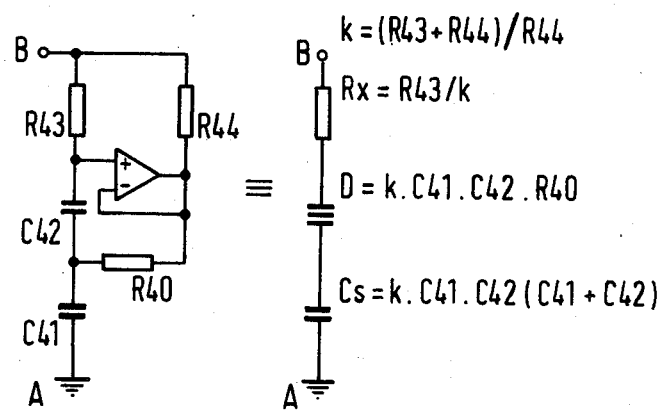
FIG. 9 shows a series lossy FDNR-resonant circuit.

One of the proposals of the present invention is the arrangement of FIG. 9, where R43 and R44 are added to the FIG. 6 arrangement, and we now have resistance, capacitance and an FDNR in the equivalent circuit-a 'lossy' FDNR resonant circuit.

Figure 10:
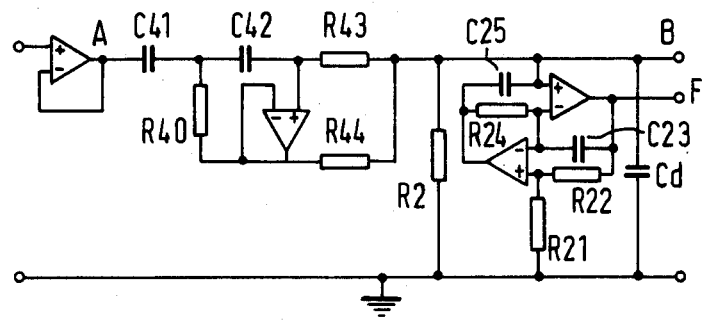
FIG. 10 is a modified version of the filter of FIG. 8 using the circuits of FIGS. 4 and 9.

This latter arrangement allows more flexibility if used in the Bruton transformed filter circuit of FIG. 10 where all the capacitors can have the same value. This arrangement differs from FIG. 8 by the addition of R44, with R43 in the R1 position. This allows a greater flexibility of choice for the other component values. A modest range of source resistances can be catered for and examples where Rs=0 and 75 Ohms are given As in the circuit of FIG. 8 the capacitor Cd can be made redundant by adding a resistor in parallel with either capacitor in the grounded 'lossless' FDNR. Thus the circuit may be reduced to four amplifiers, four equal valued capacitors and seven resistors. Computation indicates that the response of this circuit has a desirably low sensitivity to variations in component values and that, at audio frequencies, the sensitivity to the amplifier bandwidth is negligible for many applications. Practical experience shows that the above circuit is ideal for use where high performance, easy alignment and component economy are essential as in a prototype receiver where six such filters are used in the range 700 Hz to 1700 Hz with resonant Q-factors from 17 to 41.

Figure 7:
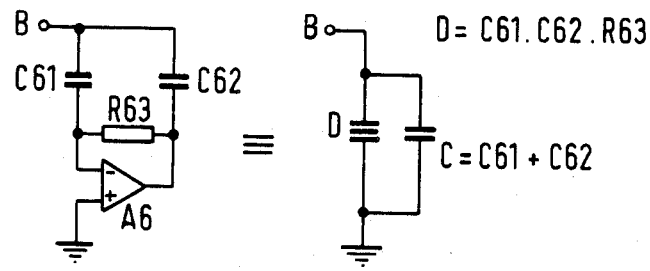
FIG. 7 is a lossy parallel FDNR circuit.
Figure 11:
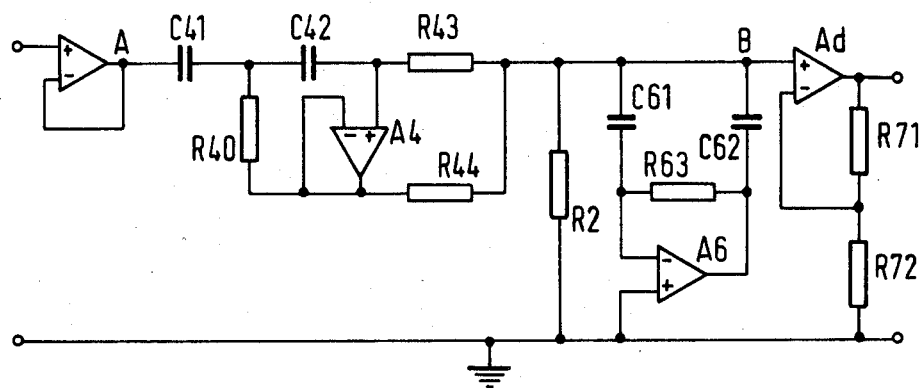
FIG. 11 is a further example of a filter according to the invention, using the lossy FDNR of FIG. 7.

The device of FIG. 7 may be used to replace the pure FDNR and capacitance Cd of FIG. 10 to effect a further simplification as shown in FIG. 11. (The word 'lossy' which appears frequently in this specification implies that a device or resonant circuit is designed to have a known finite Q-factor. The word 'lossless' implies that the device has a substantially infinite Q-factor.) An output amplifier Ad is now included to isolate the filter from the load (its gain may be varied by optional negative feedback resitors R71,R72).

This change results in an equally terminated bandpass circuit which uses four amplifiers, four equal value capacitors and seven resistors. Wide flexibility over the in-band gain is obtained because the output amplifier is now separate from the element simulations. Computation indicates that this last circuit has individual component sensitivities which are now worse than that of FIG. 10 and has a lower root-sum-of-squares sensitivity than either since there are fewer sensitive components to consider.

There are several small variations on the circuit of FIG. 11; for example, the resitor R63 may be replaced by a star connection of three resistances connected between the input, output and common (ground) terminals of the amplifier. Also, the resistor R2 may be replaced by a resistor in parallel with either of the two capacitors in the parallel 'lossy' FDNR. A minor disadvantage of the above compared with the other circuits is that a higher signal magnification occurs which might restrict the dynamic range. For a Q-factor of 17 at 700 Hz the signal magnification over the input level is 25 dB compared with 21 dB for the circuit of FIG. 10.

Care must be taken with high Q-factor bandpass filters to minimise stray capacitance. In one practical example the gain at the band centre was depressed by 0.3 dB for each pF of stray.

Some examples with component values will now be given for some variations of the above proposals along with computed sensitivity information and measured responses.

EXAMPLES

An inter-register signalling receiver uses six bandpass filters set at 200 Hz intervals from 700–1700 Hz inclusive. As an example, the 1500 Hz section is considered here using five variations of the invention. Of these variations three are of the type illustrated in FIG. 10 and two of the type shown in FIG. 11. The component sensitivites (viz. the percentage change in output amplitude for a 1% change in component value) are computed indicating worst single component within the band of interest (Smax), worst root-sum-of-squares sensitivity within the band of interest (RSS), worst single component sensitivity at 1500 Hz (Smaxo) and worst RSS at 1500 Hz (RSSo).

The five circuits were constructed and tuned to cancel out the effects of initial tolerances using the same tuning procedure for each. The resulting responses are shown and comments are made concerning the ease of tuning. A comparative criticism of the five circuits is given.

The five examples are (see below for resistor values):
(1) A Singly Terminated Bandpass Filter (FIG. 10)
   This design uses only four capacitors all of value 10 nF, four operational amplifiers and seven resistors. Independent input gain is available by adding two extra resistors to the input buffer amplifier but the output gain is tied up with the FDNR realisation and is not independently adjustable.
(2) An Equally Terminated Filter Using Five Capacitors (FIG. 10)
   This circuit topology differs from that of FIG. 10 only in that it contains a fifth capacitor, Cd, which forms the output termination.
(3) An Equally Terminated Filter Using Four Capacitors (FIG. 10)
   This circuit differs from that of FIG. 10 only in that Cd is replaced by R25 connected across C25.
(4) An Equally Terminated Filter Using a Shunt Lossy Resonant Device (FIG. 11)
   Here the two amplifier FDNR of FIG. 10 is replaced by a one amplifier FDNR. This frees the fourth amplifier for use as an output buffer with independently controllable gain. Once again only four equal-valued capacitors are required.
(5) An Equally Terminated Filter Driven From a Non-zero Source Resistance (FIG. 11)
   Here it is necessary to modify the values of R40, R43 and R44 in order to accommodate a non zero source resistance, the input buffer amplifier A being omitted. The source resistance is assumed to be 75ω.

Component values are set out in Table 1 below (all capacitors are 10nF.

TABLE 1

|   | R40 | R43 | R44 | R2 | R21 | R22 | R24 | Cd | R25 | R63 | R71 | R72 |
|---|---|---|---|---|---|---|---|---|---|---|---|---|
| 1 | 275 | 410k | 410k | 275 | 1k | 1k | 409k | 0 | — | — | | |
| 2 | 137 | 820k | 820k | 275 | 1k | 1k | 409k | 10 n | — | — | | |
| 3 | 137 | 820k | 820K | 275 | 1k | 1k | 409k | — | 409k | — | | |
| 4 | 137 | 820k | 820k | 137 | — | — | — | — | — | 820k | 1k | 1k |
| 5 | 62 | 1.31 M | 243k | 137 | — | — | — | — | — | 820k | 1k | 1k |

Figure 12:
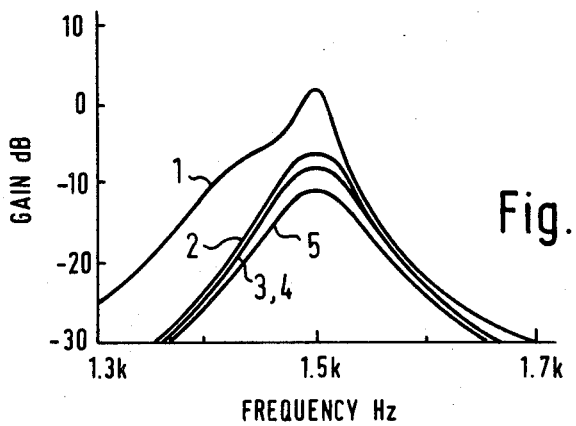
FIG. 12 illustrates particular versions of the filters of FIGS. 10 and 11.

After construction each of the five circuits is aligned according to the following procedure:
1. Apply a sinusoidal signal at 1500 Hz at a level less than 1V rms to the filter input.
2. Tune R40 and either R24 or R63 as appropriate for a maximum signal at the filter output. The tuning for the singly terminated filter required an iteration of step 2 in order to achieve a maximum, unlike the remaining four circuits. The resulting responses are compared in FIG. 12 where there is no significant difference between the performance of the circuits of Examples 2 and 3 although both show a loss at 1500 Hz of about 6 dB. The circuit of Example 4 loses a further 2 dB at 1500 Hz and non-zero source impedance circuit of FIG. 21 loses yet another 2 dB. This loss at 1500 Hz is caused primarily by parasitic capacitance between the junction of C42 and R43 and earth: the higher the simulated impedances are as seen from this node, the greater is the loss. The resulting Q-factors are also depressed.

The signal loss at 1500 Hz is not in itself a problem as long as it is repeatable. The circuits of Examples 2, 3, 4 and 5 all have a good response shape but the singly terminated filter, Example 1, has a distinctly asymmetric passband. It is possible that an alternative tuning procedure would rescue the singly terminated filter but other considerations are also against it.

The sensitivity of each filter was computed and is tabulated for comparison in Table 2:

TABLE 2

| | EXAMPLE | Smax | Smaxo | RSS | RSSo |
|---|---|---|---|---|---|
| Singly Terminated | 1 | 39.6 | 12.7 | 125 | 38 |
| Doubly Terminated With 5 capacitors | 2 | 17.5 | 2.4 | 64 | 9 |
| Doubly Terminated With 4 capacitors | 3 | 17.5 | 2.4 | 64 | 9 |
| Using Shunt 'Lossy' Resonant Device | 4 | 17.7 | 2.2 | 56 | 8 |
| Non-Zero Source | 5 | 17.3 | 5.5 | 50 | 8 |

The singly terminated filter stands out as having considerably worse sensitivity than any of the others under all criteria. The Smaxo for filter with the non-zero source resistance, although not as bad as for the singly terminated filter, is much worse than for the remaining three designs. This circuit is also more susceptible to stray capacitance than are the others.

Several variations of fourth order RC-active bandpass filter were described. The common feature was outlined and the complete set of circuits were divided into two subsets, those which contain an undamped parallel resonant device which can be damped by additional components and those which contain an inherently lossy parallel resonant circuit. Five variations were designed and constructed. Their responses were measured and their sensitivities computed. A singly terminated design was found to have comparatively poor component sensitivity and a variant which allowed for non-zero source resistances and might thus save an amplifier suffered from a slightly increased sensitivity to stray capacitance.

We claim:
1. A filter comprising:
a series resonant active filter section terminated by a parallel resonant active filter section,
the series resonant active filter section having an impedance equivalent to the series combination of capacitance, resistance and frequency dependent negative resistance, and
the parallel resonant active filter section having an impedance equivalent to the parallel connection of at least resistance and frequency dependent negative resistance,
in which the frequency dependent negative resistance, capacitance and resistance of the series resonant active filter section are provided by an ar- rangement of components comprising a capacitive potential divider connected between a low impedance input to the filter and an intermediate connection point, and a unity gain amplifier having its input connected to the intermediate connection point and its output connected via a first resistance to the tapping point of the divider, the intermediate connection point being connected via a second resistance to the parallel resonant active filter section.

2. A filter according to claim 1 in which a third resistance is connected between the amplifier output and the parallel filter section.

3. A filter according to claim 2 in which the impedance of the parallel resonant section includes parallel capacitance.

4. A filter according to claim 2 in which the frequency dependent negative resistance of a parallel resonant section is provided by a pair of amplifiers interconnected by impedances.

5. A filter according to claim 4 in which the impedance of the parallel resonant section includes parallel capacitance which is provided at least partly by the said amplifier/impedance arrangement.

6. A filter according to claim 3 in which the frequency dependent negative resistance, and the capacitance, of the parallel filter section are provided by an arrangement in which a first terminal is connected by capacitances to the input and output of a high gain inverting amplifier, with a resistive element or network connected between the amplifier input and output.

7. A filter according to claim 6 in which the resistance of the parallel resonant section is provided partly or in whole by resistance connected in parallel with either or both the said capacitances.

8. A series resonant element comprising:

a capacitive potential divider connected between a first terminal and an intermediate node and having a divider tapping point, a unity gain amplifier having an input connected to the intermediate node and an output connected by a first resistance to the tapping point of the divider, and a second terminal connected by a second resistance to the intermediate node and by a third reistance to the output of the amplifier, a series resonant impedance being provided between said first and second terminals.

9. A series resonant element according to claim 8 in which the first terminal is connected to the common line of the amplifier.

10. A series resonant element according to claim 8 in which the first terminal is isolated from the common line of the amplifier and is connected, in use, to a low-impedance input.

* * * * *